US009080925B2

(12) United States Patent
Schwab et al.

(10) Patent No.: US 9,080,925 B2
(45) Date of Patent: Jul. 14, 2015

(54) ENGINE VIBRATION AND ENGINE TRIM BALANCE TEST SYSTEM, APPARATUS AND METHOD

(75) Inventors: Robert B. Schwab, Bellevue, WA (US); Jan Donald Klingman, Seattle, WA (US); Giang Pham, Bothell, WA (US)

(73) Assignee: The Boeing Company, Chicago, IL (US)

( * ) Notice: Subject to any disclaimer, the term of this patent is extended or adjusted under 35 U.S.C. 154(b) by 499 days.

(21) Appl. No.: 13/495,447

(22) Filed: Jun. 13, 2012

(65) Prior Publication Data

US 2013/0338982 A1  Dec. 19, 2013

(51) Int. Cl.
*G06G 7/48* (2006.01)
*G06F 17/50* (2006.01)
*G01M 15/02* (2006.01)
*G01M 15/12* (2006.01)
*G01H 1/00* (2006.01)
*G01M 7/00* (2006.01)

(52) U.S. Cl.
CPC ............. *G01M 15/02* (2013.01); *G01M 15/12* (2013.01); *G06F 17/5086* (2013.01); *G01H 1/003* (2013.01); *G01M 7/00* (2013.01)

(58) Field of Classification Search
CPC .. G06F 17/5086; G06F 17/5075; G01M 7/00; G01M 9/00; G01M 13/028; G01M 17/00; G01M 15/12; G01H 1/003; G01H 1/006; G01N 2291/2693; G01N 2291/2694; G01N 29/12; G10K 2210/3035; Y02T 10/82
USPC ............................................................ 703/8
See application file for complete search history.

(56) References Cited

U.S. PATENT DOCUMENTS

| 4,213,114 | A | | 7/1980 | Cochard |
| 4,480,480 | A | | 11/1984 | Scott et al. |
| 5,065,959 | A | | 11/1991 | Bhatia |
| 5,111,704 | A | | 5/1992 | Hill |
| 5,210,704 | A | * | 5/1993 | Husseiny .................. 702/34 |

(Continued)

OTHER PUBLICATIONS

Ibe, Tochukwu, "Investigation of Vibration Control Sensors of Flying Vehicles", IFAC Workshop, Jun. 30-Jul. 2, 2009.*

(Continued)

*Primary Examiner* — Mary C Jacob
(74) *Attorney, Agent, or Firm* — Baldauff IP, LLC; Michael J. Baldauff, Jr.

(57) ABSTRACT

The present disclosure is generally directed to a simulated aircraft engine accelerometer apparatus, system and method that that generates aircraft engine simulator outputs. An accelerometer signal simulator receives aircraft engine simulator outputs and generates accelerometer signal simulator outputs, and an accelerometer waveform generator receives the accelerometer signal simulator outputs and synchronizes at least one accelerometer signal simulator outputs to a reference timing signal from one of the aircraft engine simulator outputs. The simulated accelerometer further includes a filter section that receives and filters noise from the plurality of accelerometer waveform generator outputs to generate a plurality of filtered accelerometer waveform generator outputs, a mixer that receives and combines each of the plurality of filtered accelerometer waveform generator outputs to generate a single filtered accelerometer waveform generator output, and a charge converter that receives and converts the single filtered accelerometer waveform generator output to a current charge vibration simulation output.

20 Claims, 5 Drawing Sheets

(56) References Cited

U.S. PATENT DOCUMENTS

| | | | |
|---|---|---|---|
| 5,565,618 A | 10/1996 | Hu | |
| 5,586,065 A * | 12/1996 | Travis | 702/191 |
| 5,675,505 A * | 10/1997 | Trimboli | 702/113 |
| 5,965,816 A | 10/1999 | Hu | |
| 6,002,778 A | 12/1999 | Rossetti et al. | |
| 6,098,022 A * | 8/2000 | Sonnichsen et al. | 702/35 |
| 6,185,470 B1 | 2/2001 | Pado et al. | |
| 6,904,371 B2 * | 6/2005 | Sonnichsen et al. | 702/56 |
| 6,928,370 B2 * | 8/2005 | Anuzis et al. | 702/56 |
| 6,983,199 B2 | 1/2006 | Mollmann et al. | |
| 7,222,002 B2 | 5/2007 | Maine | |
| 8,548,780 B2 * | 10/2013 | Skelly et al. | 703/8 |
| 2005/0125103 A1 | 6/2005 | Ferrer | |
| 2008/0257051 A1 * | 10/2008 | Schierenbeck | 73/663 |

OTHER PUBLICATIONS

Schumacher et al, "Engine Contribution Analysis Using a Noise and Vibration Simulator", Sound & Vibration, Jan. 2009.*

Howe et al, "Jet Engine Test Strategy-Program Overview and Objectives", IEEE, 2000.*

Rowan, B. F., "Rotordynamics Analysis of the Space Shuttle Main Engine High-Pressure Oxidizer Pump", American Institute of Aeronautics and Astronautics, 1980.*

Extended European Search Report dated Nov. 19, 2013 in EP Application Serial No. 13170892.7.

* cited by examiner

ENGINE VIBRATION AND ENGINE TRIM BALANCE TEST SYSTEM, APPARATUS AND METHOD

FIELD OF INVENTION

The general field of the embodiments presented herein is directed to simulation of aircraft engine testing, and more particularly to a system, method and apparatus of multiple accelerometer simulation for aircraft engine and engine component testing.

BACKGROUND

Existing solutions to aircraft engine testing include testing flight test aircraft by adding or removing balance weights to the fan and low pressure turbine. The drawbacks to this method of testing are that it is expensive to run as it requires fuel to burn during testing, it requires additional hours to add and remove weights, and it introduces a potential to damage engine and flight test aircraft. Another method includes generating signals using a signal generator to a vibration measuring Line Replacement Unit (LRU). However, drawbacks to this method include the requirement of manual calculation for each test condition, and that one signal may be generated at a time, which limits the evaluation to only one vibration type at a time. This method also requires manual manipulation and validation of each tested condition.

There is a need to provide a test system with the ability to generate accelerometer signals that replicate the complexities of multiple aircraft engine accelerometers in the field in such a manner to generate these signals in a controlled laboratory test environment. It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, an accelerometer simulation system for testing an engine includes a number of simulated accelerometers and a monitor unit that receives current charge vibration simulation output from each simulated accelerometer to measure a simulated total engine vibration. Each simulated accelerometer includes an engine simulator that generates a number of engine simulator outputs, and an accelerometer signal simulator that receives the engine simulator outputs and that generates a number of accelerometer signal simulator outputs. The simulated accelerometer further includes an accelerometer waveform generator that receives the accelerometer signal simulator outputs and synchronizes at least one of the accelerometer signal simulator outputs to a reference timing signal from the engine simulator outputs, where the accelerometer waveform generator generates a number of accelerometer waveform generator outputs. The simulated accelerometer further includes a filter section that receives and filters noise from the accelerometer waveform generator outputs to generate a number of filtered accelerometer waveform generator outputs. A mixer receives and combines each of the filtered accelerometer waveform generator outputs to generate a single filtered accelerometer waveform generator output. A charge converter receives and converts the single filtered accelerometer waveform generator output to a current charge vibration simulation output.

In another embodiment disclosed herein, a simulated engine accelerometer includes an engine simulator that generates a number of engine simulator outputs, and an accelerometer signal simulator that receives the engine simulator outputs and generates a number of accelerometer signal simulator outputs. The engine simulator further includes an accelerometer waveform generator that receives the accelerometer signal simulator outputs and synchronizes at least one of the accelerometer signal simulator outputs to a reference timing signal from one of the engine simulator outputs, where the accelerometer waveform generator generates a number of accelerometer waveform generator outputs. The simulated accelerometer further includes a filter section that receives and filters noise from the accelerometer waveform generator outputs to generate a number of filtered accelerometer waveform generator outputs. The engine simulator further includes a mixer that receives and combines each of the filtered accelerometer waveform generator outputs to generate a single filtered accelerometer waveform generator output, and a charge converter that receives and converts the single filtered accelerometer waveform generator output to a current charge vibration simulation output.

In another embodiment disclosed herein, a method for simulating vibration testing of an engine includes generating a number of engine simulator outputs, generating a number of accelerometer signal simulator outputs based on the engine simulator outputs, and synchronizing at least one of the accelerometer signal simulator outputs to a reference timing signal from one of the engine simulator outputs to generate a number of accelerometer waveform generator outputs. The method further includes filtering noise from the accelerometer waveform generator outputs and generating a number of filtered accelerometer waveform generator outputs, combining each of the filtered accelerometer waveform generator outputs to generate a single filtered accelerometer waveform generator output, and converting the single filtered accelerometer waveform generator output to a current charge vibration simulation output.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein.

DETAILED DESCRIPTION

Figure 1:
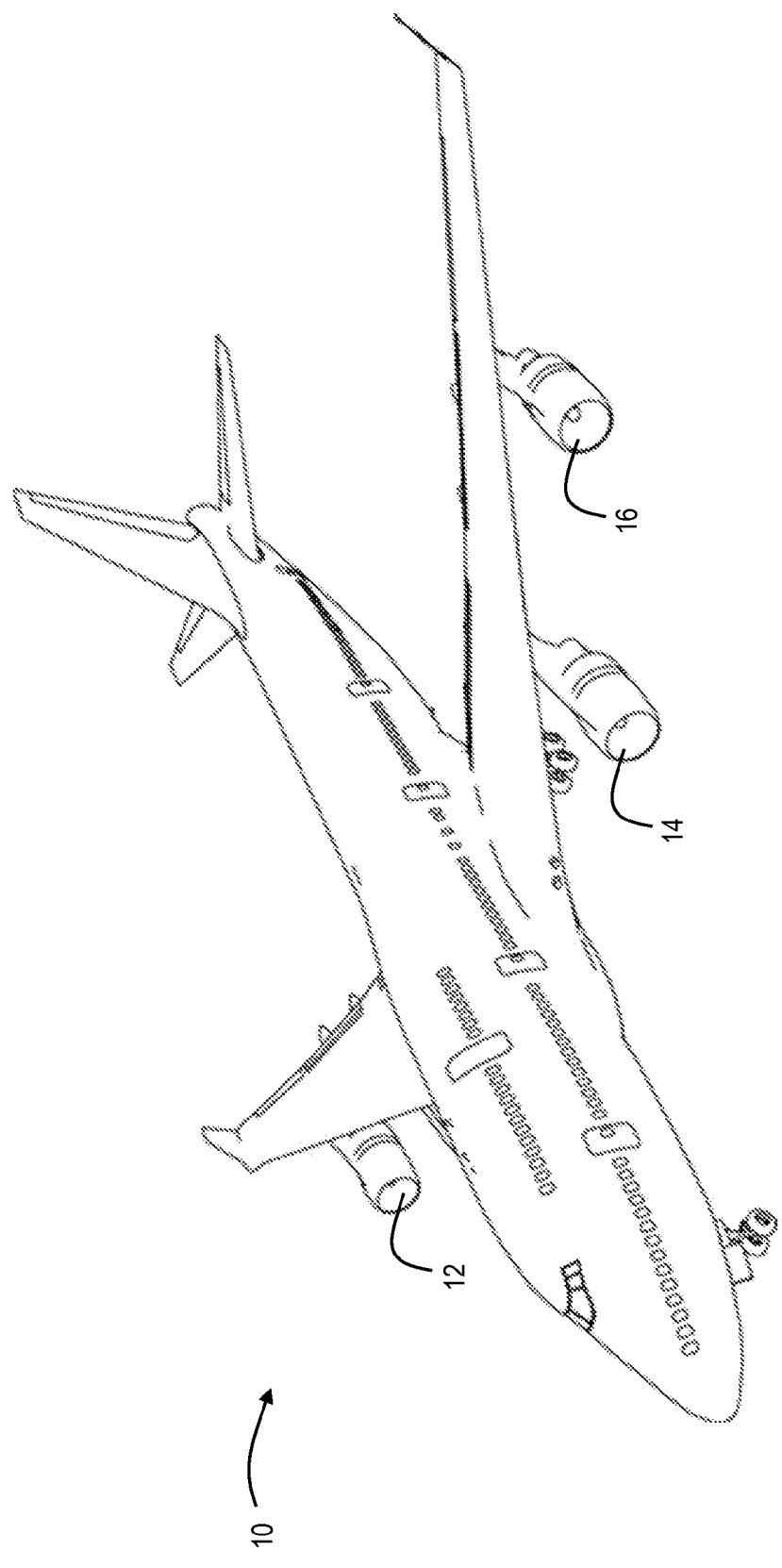
FIG. 1 is an illustration of an aircraft incorporating a turbojet engine in accordance with a preferred embodiment presented herein.
Figure 2:
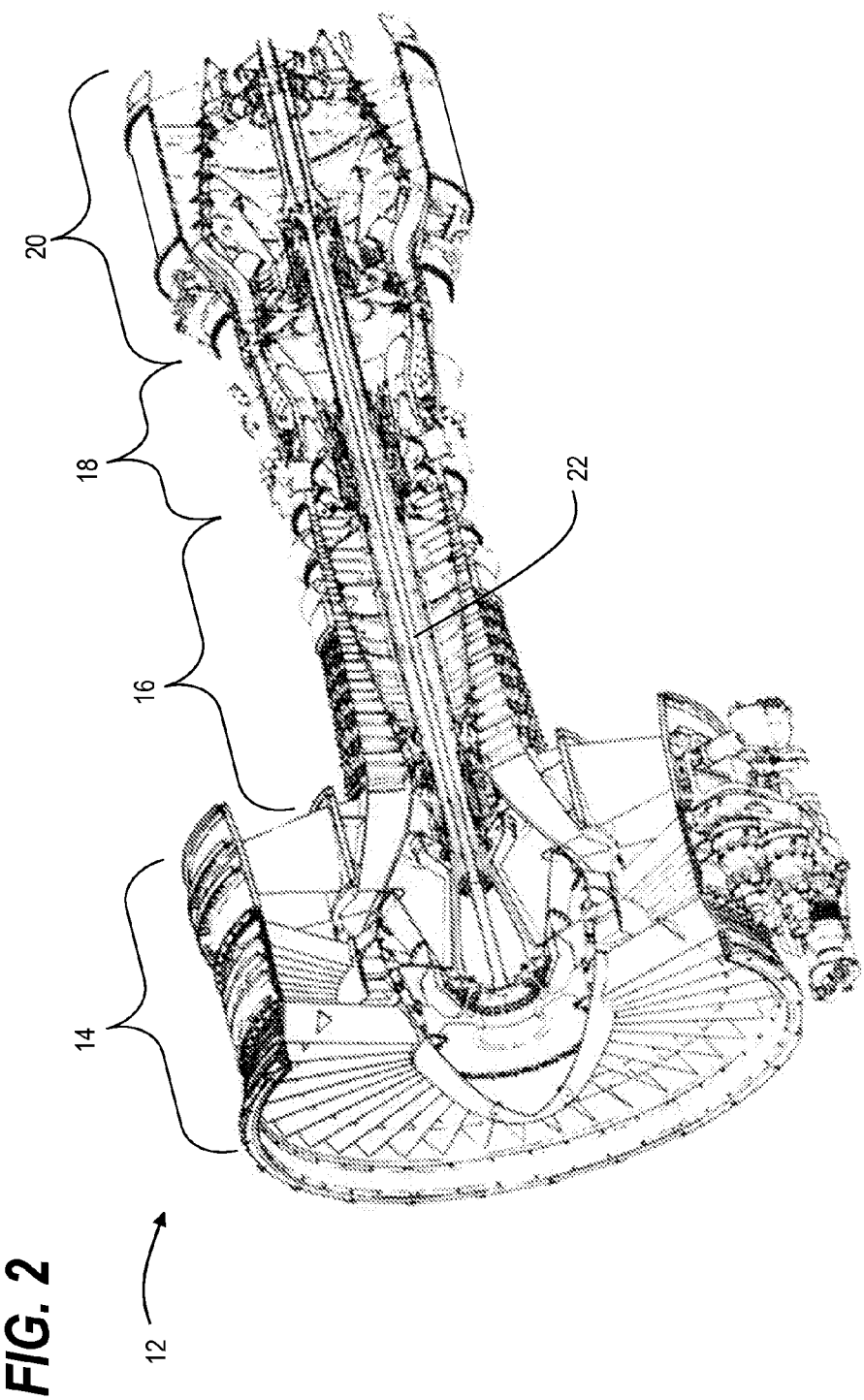
FIG. 2 is a perspective cut-away view of a turbojet shown in FIG. 1, in accordance with a preferred embodiment presented herein.

The following detailed description is directed to providing a system that allows the maximum ability to test airplane level integration of a Line Replaceable Unit (LRU) which monitors engine vibration. Typical LRUs which have this function include the Airborne Vibration Monitor (AVM) installed in the airplane's avionics suite, the Engine Monitor Unit (EMU) mounted on the engine, and a Health and Usage Monitor System (HUMS) in a rotorcraft, although this list of LRUs is not exhaustive, and alternative semantics exist. The design of this system can be applied or tailored to similar LRUs installed on other engines/aircraft types/rotorcraft. Airplane level integration testing is focused on validation and verification of Engine Indication displays, events, messages as well as interaction with diagnostic and prognostic maintenance operations related to an engine vibration system. The LRU uses accelerometers to measure vibrations in an aircraft engine 12. With reference to FIGS. 1 and 2, an aircraft 10 includes one or more engines 12, 14, 16 which burn fuel with air to create thrust and propel the aircraft 10 through the air. For example, the engine 12 may be a turbojet, turbofan, or any engine having rotating parts or otherwise. For instance, FIG. 2 illustrates a representative turbofan jet engine 12 including a fan section 14, a compressor section 16, a combustion section 18 and a turbine section 20. The fan section 14, compressor section 16 and turbine section 20 are mounted on concentrically disposed shafts at 22. The engine 12 may be comprised of one or more shafts. Note that these shafts may or may not be concentric with each other, and that any of the shaft speeds may or may not be independent with any of the other shaft speeds. Rotating components linked to a shaft, such as couplers and gearboxes (not shown), may rotate a different speeds than the shafts. Although turbofan jet engine 12 is an exemplary application of the system and method described herein, many other types of engines may be used to obtain the benefits of the system and method described herein.

The airplane integration level testing requires monitoring tracked order vibration, broadband vibration and engine trim and balance. Tracked order vibration monitor integration testing requires the ability to independently control a magnitude of vibrations experienced by multiple accelerometers located at various places with the engine 12 at various sections, e.g., the fan section 14, the compressor section 16 and the turbine section 20. Engine trim and balance requires the ability of the LRU to derive the phase angle of the maximum vibration as related to the once per revolution indication either embedded within the engine rotor speed signal or via a separate once-per-rev signal. The engine accelerometer vibration signals are a function of the vibration of the multiple components of an engine including the fan 14, compressor 16, turbine 20, as well as many others within the engine and those induced in an integrated airframe environment. Since many of these engine components in the engine run at different rotational speeds, the engine vibration signal is mainly a function of the different rotational speeds and the vibration magnitudes associated with those speeds. Each engine accelerometer experiences the vibration of each of these engine speeds, and thus the LRU must be able to differentiate the influence each engine component. Therefore, this requires a test system to provide the ability to generate accelerometer signals that replicate these complexities.

Figure 3:
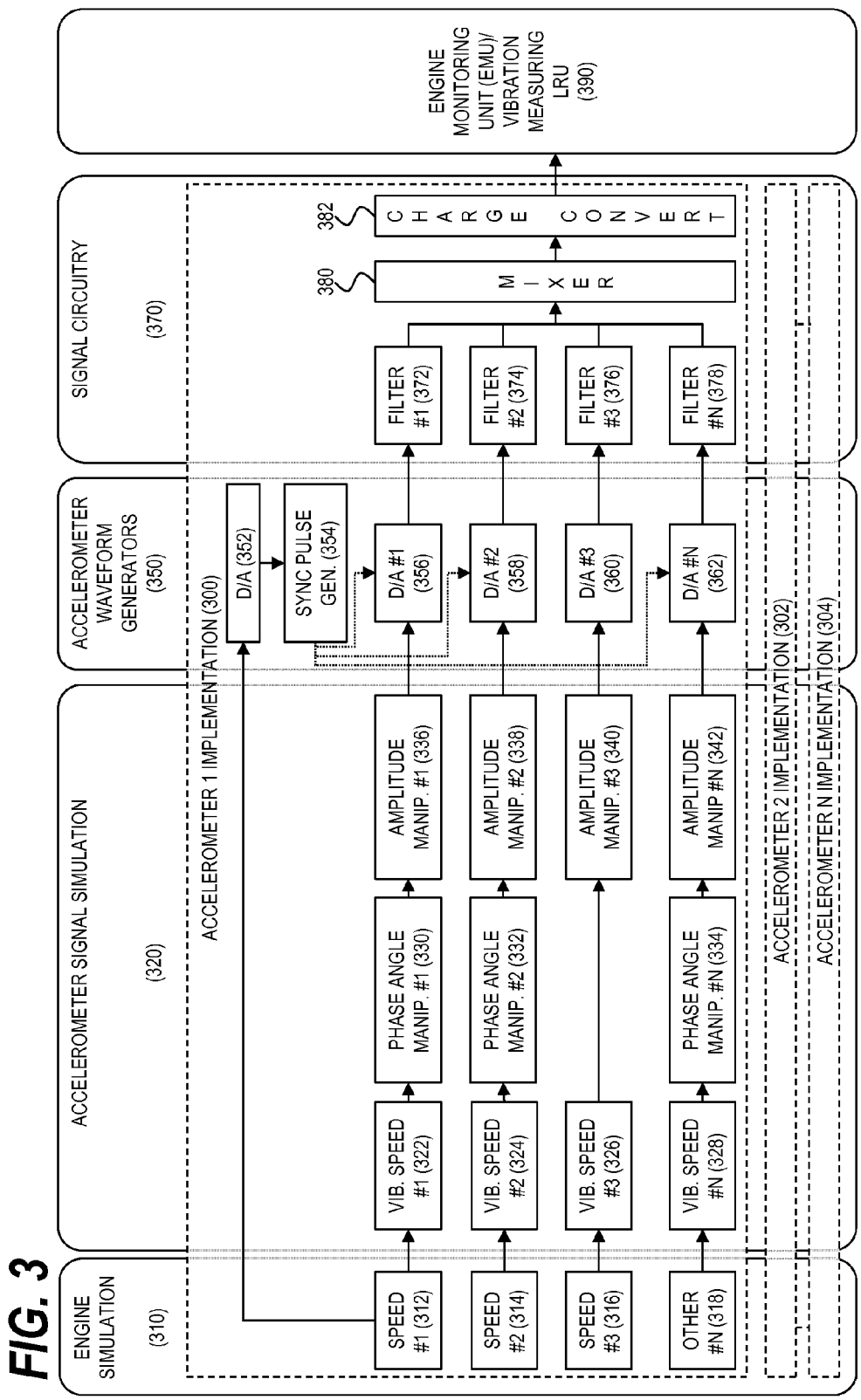
FIG. 3 illustrates one embodiment of an accelerometer simulation system for testing an aircraft engine according to at least one embodiment disclosed herein.

The following provides an overview of the Engine Vibration Test System (EVTS), as shown in FIG. 3. The EVTS simulates an engine accelerometer's input to an LRU, such as the EMU. The EVTS is comprised of five formal parts for each simulated accelerometer: signal generators, synchronization circuits, charge converter circuits, mixer circuits, and engine simulation interfaces. The signal generator is comprised of a series of Versa Module Eurocard (VME) boards to produce individual waveforms representing vibrations related to each engine component, (fan, turbine, compressor, gearbox, etc.), as well as other sources of vibrations, (generators, pumps, etc.). Although the VME boards are described herein, other types of signal generating boards may be used that accomplish a similar function. The synchronization circuit synchronizes the VME Board Vibration Waveform Output for the Fan to another signal which represents the Fan speed which the EMU observes independently. The EMU correlates the engine fan speed and the synchronized accelerometer input to devise the phase angle in support of the engine trim and balance. The Mixer circuit combines synchronized engine fan waveforms with non-synchronized waveforms (turbine, compressor, pumps, generators, etc.). The charge converter circuit converts the waveform into a charge that represents the accelerometer. The simulation computes all the engine speeds, and computes all the voltages, frequencies, and phase angle manipulations that are sent to the signal generators. Overall, the EVTS allows the user to represent thousands of vibration test conditions to the EMU without risk or damage to the EMU and provides an inexpensive means to prove out any interfaces with aircraft flight deck displays, maintenance systems, without expensive flight test on the real aircraft.

FIG. 3 illustrates one embodiment presented herein for an accelerometer simulation system for testing an aircraft engine includes simulated accelerometers, e.g., accelerometer "1" 300, accelerometer "2" 302, and accelerometer "N" 304. Each simulated accelerometer includes a number of components used to create a simulated signal that is transmitted and processed by an Engine Monitor Unit (EMU) 390. The number of simulated accelerometers 300, 302 and 304 represent corresponding actual accelerometers placed at specific test locations on the aircraft engine 12 and provide simulated vibration signal output to the EMU 390.

The first component for each of the number of simulated accelerometers is an aircraft engine simulator 310 that generates aircraft engine simulator outputs 312, 314, 316 and 318. Each of these outputs from this stage are representative of an actual speed of a specific component of an aircraft engine, e.g., speed #1, 312, speed #2, 314 and speed #3, 316, or a non-aircraft engine component/aircraft engine non-shaft vibration component, "other #N," 318, that contributes to a vibrational input on the aircraft engine 12. The speed related components of the aircraft engine may be from any portion of the fan, compressor or turbine assemblies, whereas, the non-aircraft engine/aircraft engine non-shaft vibration component may be any source of vibration that originates from sources other than the aircraft engine 12 or are not speed dependent on parts within the aircraft engine.

Another component for each of the number of simulated accelerometers is an accelerometer signal simulator 320 that receives the number of aircraft engine simulator outputs, e.g., the speed based outputs 312, 314 and 316, and the non-speed based output(s) 318, and generates accelerometer signal simulator outputs. To generate these outputs, vibration speed simulators 322, 324, 326 and 328 receive each of the number of simulated speed outputs 312, 314 and 316 and at least one simulated vibration output 318, and generate a respective vibration speed output. Some of these outputs (from 322, 324 and 328) may be received at phase angle manipulators 330, 332 and 334 that insert a phase angle value to generate a respective phase angle output. The phase angle output is based on a reference angle of rotation of the aircraft engine as it rotates about the central shafts 22. Amplitude manipulators 336, 338, 340 and 342 receive each of the respective phase angle outputs, (and the vibration speed #3 without any phase angle manipulation), and modifies an amplitude value to generate a respective amplitude output.

Another component for each of the number of simulated accelerometers is an accelerometer waveform generator 350 that receives the number of accelerometer signal simulator outputs and synchronizes at least one accelerometer signal simulator output to a reference timing signal from one of the number of aircraft engine simulator outputs, for example, from speed #1, 312. The accelerometer waveform generator 350 generates accelerometer waveform generator outputs by first using a digital-to-analog (D/A) converter 352 to receive and convert the reference timing signal from engine simulation 310 speed #1, 312 output to an analog reference timing signal. D/A converters D/A #1 356, D/A #2 358, D/A #3 360 and D/A #N 362 convert each respective amplitude output to a respective analog signal output and a synchronized pulse generator 354 receives the analog reference timing signal and synchronizes at least one of the analog signal outputs via the number of D/A converters, e.g., D/A #1 356, D/A #2 358 and D/A #N 362, to generate a respective synchronized analog signal output.

Another component for each of the number of simulated accelerometers includes a filter section, 372, 374, 376 and 378 that receives and filters noise from the number of accelerometer waveform generator outputs, e.g., from 356, 358 and 362 and each non-synchronized respective analog signal outputs, e.g., from 360, to generate filtered accelerometer waveform generator outputs.

Each simulated accelerometer further includes a mixer 380 that receives and combines each of the number of filtered accelerometer waveform generator outputs that include a vibration speed output, a phase angle output, an amplitude output, a synchronized analog signal output, and a non-synchronized analog signal output, thereby generating the single filtered accelerometer waveform generator output.

Finally, a charge converter 382 receives the output from the mixer 380 and converts the single filtered accelerometer waveform generator output to a current charge vibration simulation output. An engine monitoring unit 390 receives each current charge vibration simulation output from each of the number of simulated accelerometers to measure a simulated total aircraft engine vibration.

Figure 4:
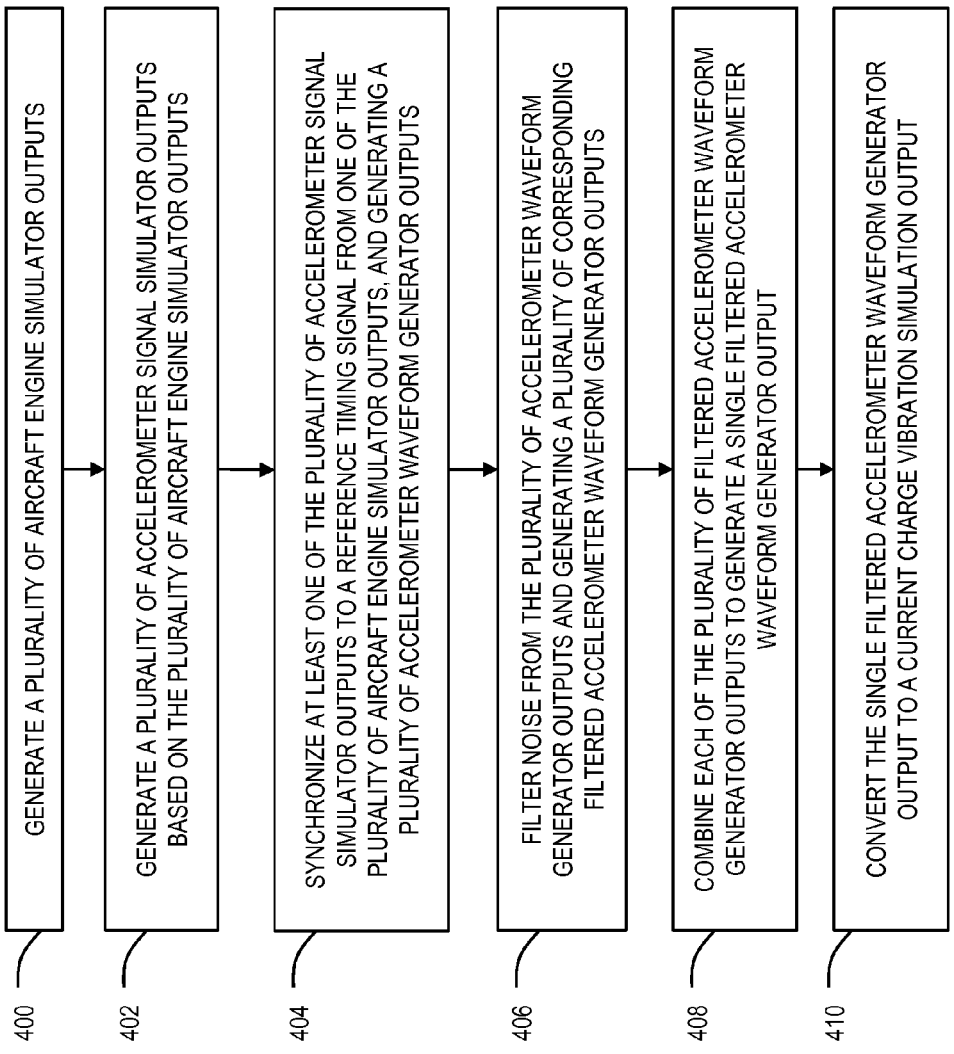
FIG. 4 illustrates a logic flow diagram of an embodiment of an accelerometer simulation testing method of an aircraft engine according to at least one embodiment disclosed herein.

FIG. 4 illustrates a method for simulating vibration testing of an aircraft engine including generating 400 aircraft engine simulator outputs, by generating simulated speed outputs each representative of an actual speed of a specific component of the aircraft engine, the specific component being one of a fan, a compressor and a turbine, and generating at least one simulation vibration output of a non-aircraft engine source of vibration or an aircraft engine non-shaft source of vibration.

The method further includes generating 402 accelerometer signal simulator outputs based on the number of aircraft engine simulator outputs, by generating vibration speed outputs for each of the number of accelerometer signal simulator outputs, generating a phase angle output for at least one of the number of accelerometer signal simulator outputs, and generating an amplitude output for each of the number of accelerometer signal simulator outputs.

The method further includes synchronizing 404 at least one of the number of accelerometer signal simulator outputs to a reference timing signal from one of the number of aircraft engine simulator outputs, and generating accelerometer waveform generator outputs, by converting the reference timing signal to an analog reference timing signal, converting each amplitude output to an analog signal output, and synchronizing at least one of the analog signal outputs to generate a synchronized analog signal output.

The method further includes filtering 406 noise from the number of accelerometer waveform generator outputs and generating filtered accelerometer waveform generator outputs, by receiving each synchronized analog signal outputs and each non-synchronized analog signal outputs to generate corresponding filtered signal outputs.

The method further includes combining each of the number of filtered accelerometer waveform generator outputs to generate a single filtered accelerometer waveform generator output 408, by receiving the filtered signal outputs that include a vibration speed output, a phase angle output, an amplitude output, a synchronized analog signal output, and a non-synchronized analog signal output, and then generates the single filtered accelerometer waveform generator output from each of these outputs. The method further includes converting 410 the single filtered accelerometer waveform generator output to a current charge vibration simulation output.

Thus, the embodiments presented herein allow a user to represent thousands of vibration test conditions to the EMU without risk or damage to the LRU and provides an inexpensive means to prove out any interfaces with aircraft flight deck displays and maintenance systems without expensive flight test on the real aircraft.

Figure 5:
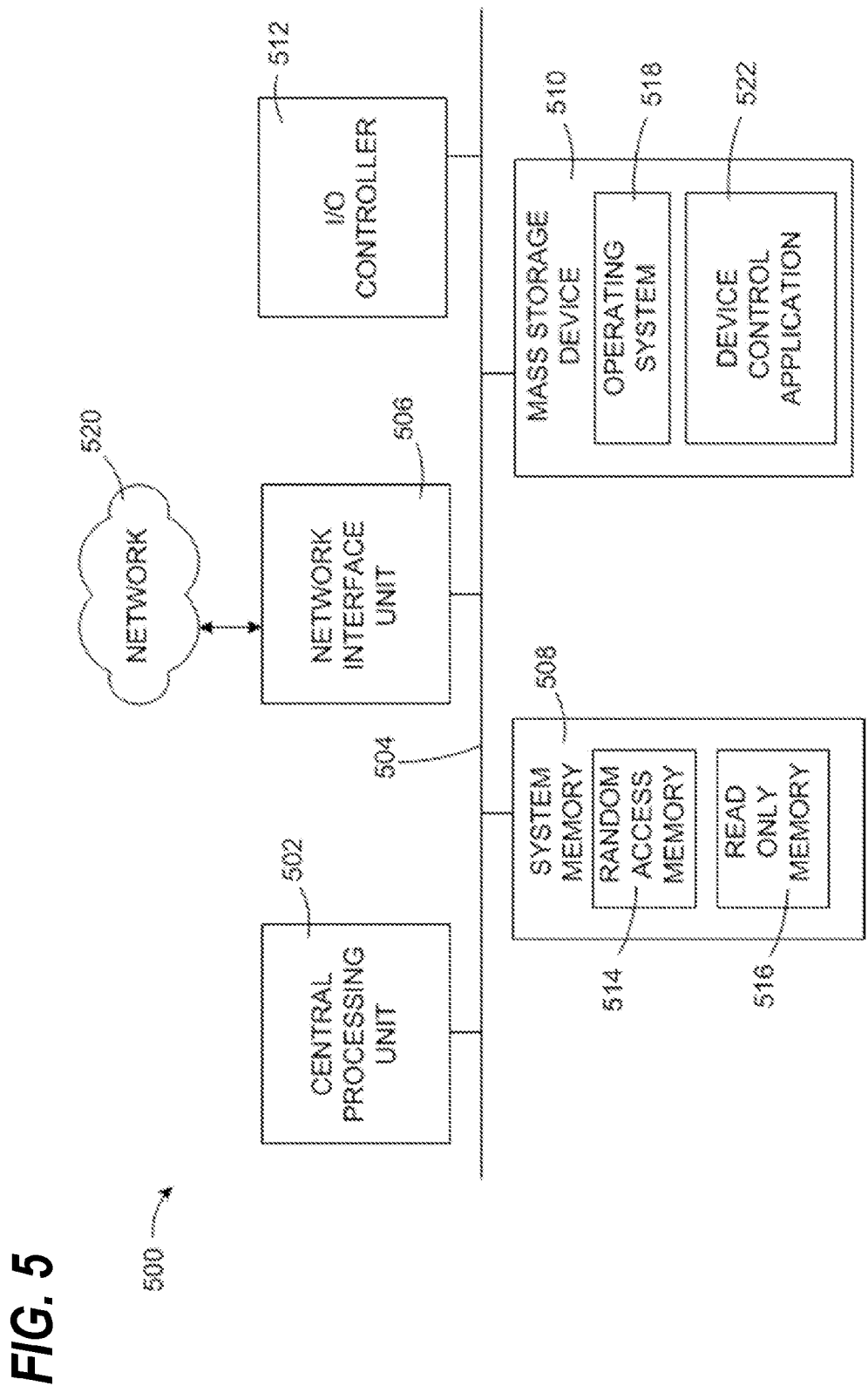
FIG. 5 is a computer architecture diagram showing an illustrative computer hardware and software architecture for a computing system capable of implementing the embodiments presented herein.

FIG. 5 shows illustrative computer architecture for a computer 500 capable of executing the software components described herein for implementing the embodiments described above. The computer architecture shown in FIG. 5 illustrates a conventional desktop, laptop computer, server computer, tablet computer, smartphone, electronic reader, MP3 player or other digital music device, or any computer configured for use with a system for testing an engine and may be utilized to implement the computer 500 and to execute any of the other software components described herein.

The computer architecture shown in FIG. 5 includes a central processing unit 502 (CPU) or processor, a system memory 508, including a random access memory 514 (RAM) and a read-only memory (ROM) 516, and a system bus 504 that couples the memory to the CPU 502. A basic input/output system (BIOS) containing the basic routines that help to transfer information between elements within the computer 500, such as during startup, is stored in the ROM 516. The computer 500 further includes a mass storage device 510 for storing an operating system 518, application programs, and other program modules, which will be described in greater detail below.

The mass storage device 510 is connected to the CPU 502 through a mass storage controller (not shown) connected to the bus 504. The mass storage device 510 and its associated computer-readable media provide non-volatile storage for the computer 500. Although the description of computer-readable media contained herein refers to a mass storage device, such as a hard disk or CD-ROM drive, it should be appreciated by those skilled in the art that computer-readable storage media can be any available computer storage media that can be accessed by the computer 500.

By way of example, and not limitation, computer-readable storage media may include volatile and non-volatile, removable and non-removable media implemented in any method or technology for storage of information such as computer-readable instructions, data structures, program modules or other data. For example, computer-readable storage media includes, but is not limited to, RAM, ROM, EPROM, EEPROM, flash memory or other solid state memory technology, CD-ROM, digital versatile disks (DVD), HD-DVD, BLU-RAY, or other optical storage, magnetic cassettes, magnetic tape, magnetic disk storage or other magnetic storage devices, or any non-transitory medium which can be used to store the desired information and which can be accessed by the computer 500.

It should be appreciated that the computer-readable media disclosed herein also encompasses communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media. Computer-readable storage media does not encompass communication media.

According to various embodiments, the computer 500 may operate in a networked environment using logical connections to remote computers through a network such as the network 520. The computer 500 may connect to the network 520 through a network interface unit 506 connected to the bus 504. It should be appreciated that the network interface unit 506 may also be utilized to connect to other types of networks and remote computer systems. The computer 500 may also include an input/output controller 512 for receiving and processing input from a number of other devices, including a touchscreen interface 100, keyboard, mouse, joystick, or electronic stylus (not shown in FIG. 5). Similarly, an input/output controller may provide output to a display screen, a printer, or other type of output device (also not shown in FIG. 5).

As mentioned briefly above, a number of program modules and data files may be stored in the mass storage device 510 and RAM 514 of the computer 500, including an operating system 518 suitable for controlling the operation of a networked desktop, laptop, tablet, smartphone, electronic reader, digital music player, server, or flight computer. The mass storage device 510 and RAM 514 may also store one or more program modules. In particular, the mass storage device 510 and the RAM 514 may store the device control application 522 executable to perform the various operations described above. The mass storage device 510 and RAM 514 may also store other program modules and data.

In general, software applications or modules may, when loaded into the CPU 502 and executed, transform the CPU 502 and the overall computer 500 from a general-purpose computing system into a special-purpose computing system customized to perform the functionality presented herein. The CPU 502 may be constructed from any number of transistors or other discrete circuit elements, which may individually or collectively assume any number of states. More specifically, the CPU 502 may operate as one or more finite-state machines, in response to executable instructions contained within the software or modules. These computer-executable instructions may transform the CPU 502 by specifying how the CPU 502 transitions between states, thereby physically transforming the transistors or other discrete hardware elements constituting the CPU 502.

Encoding the software or modules onto a mass storage device may also transform the physical structure of the mass storage device or associated computer-readable storage media. The specific transformation of physical structure may depend on various factors, in different implementations of this description. Examples of such factors may include, but are not limited to: the technology used to implement the computer-readable storage media, whether the computer-readable storage media are characterized as primary or secondary storage, and the like. For example, if the computer-readable storage media is implemented as semiconductor-based memory, the software or modules may transform the physical state of the semiconductor memory, when the software is encoded therein. For example, the software may transform the states of transistors, capacitors, or other discrete circuit elements constituting the semiconductor memory.

As another example, the computer-readable storage media may be implemented using magnetic or optical technology. In such implementations, the software or modules may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope and spirit of the present description, with the foregoing examples provided only to facilitate this discussion.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

The invention claimed is:

1. A system for testing simulating engine vibration for an engine monitoring unit, the system comprising:
  a processor for executing a device control application stored in memory to generate a plurality of components of a plurality of simulated accelerometers, each simulated accelerometer including:
    an engine simulator that generates, via the processor, a plurality of engine simulator outputs;
    an accelerometer signal simulator that receives, via the processor, the plurality of engine simulator outputs and generates a plurality of accelerometer signal simulator outputs;
    an accelerometer waveform generator circuit, including a digital-to-analog (D/A) converter, that receives the plurality of accelerometer signal simulator outputs and synchronizes at least one of the plurality of accelerometer signal simulator outputs to a reference timing signal from one of the plurality of engine simulator outputs, the accelerometer waveform generator generating a plurality of accelerometer waveform generator outputs;
    a filter section that receives and filters noise from the plurality of accelerometer waveform generator outputs to generate a plurality of filtered accelerometer waveform generator outputs;
a mixer that receives and combines each of the plurality of filtered accelerometer waveform generator outputs to generate a single filtered accelerometer waveform generator output; and
a charge converter that receives and converts the single filtered accelerometer waveform generator output to a current charge vibration simulation output; and
the engine monitoring unit that receives each current charge vibration simulation output from each of the plurality of simulated accelerometers to measure a simulated total engine vibration.

2. The system according to claim 1, the plurality of simulated accelerometers represent a plurality of corresponding actual accelerometers placed at specific test locations on the engine and provide simulated vibration signal output to the monitor unit consistent with the plurality of corresponding actual accelerometers at each specific test location over various engine speeds.

3. The system according to claim 1, wherein the engine simulator further comprises:
a plurality of simulated speed outputs each representative of an actual speed of a specific component of an aircraft engine, the specific component being one of a fan, a compressor and a turbine; and
simulated vibration output of one of a non-aircraft engine source of vibration and an aircraft engine non-shaft source of vibration.

4. The system according to claim 3, wherein the accelerometer signal simulator further comprises:
a plurality of vibration speed simulators that receive each of the plurality of simulated speed outputs and the at least one simulated vibration output and generates a respective vibration speed output;
a plurality of phase angle manipulators that receive each respective vibration speed output and inserts a phase angle value to generate a respective phase angle output; and
a plurality of amplitude manipulators that receive each respective phase angle output and modifies an amplitude value to generate a respective amplitude output.

5. The system according to claim 4, the accelerometer waveform generator circuit further comprises:
the D/A converter that receives and converts the reference timing signal to an analog reference timing signal;
a plurality of D/A converters that convert each respective amplitude output to a respective analog signal output; and
a synchronized pulse generator that receives the analog reference timing signal and synchronizes at least two of the analog signal outputs via the plurality of D/A converters to generate a respective synchronized analog signal output.

6. The system according to claim 5, the filter section comprising a plurality of filters that receive each respective synchronized analog signal outputs and each non-synchronized respective analog signal outputs to generate corresponding filtered signal outputs.

7. The system according to claim 6, the mixer receiving the corresponding filtered signal outputs including, a vibration speed output, a phase angle output, an amplitude output, a synchronized analog signal output, and a non-synchronized analog signal output, and
generating the single filtered accelerometer waveform generator output from each of these outputs.

8. A simulated engine accelerometer comprising:
an engine simulator that generates a plurality of engine simulator outputs;
an accelerometer signal simulator that receives the plurality of engine simulator outputs and generates a plurality of accelerometer signal simulator outputs;
an accelerometer waveform generator circuit that receives the plurality of accelerometer signal simulator outputs and synchronizes at least one of the plurality of accelerometer signal simulator outputs to a reference timing signal from one of the plurality of engine simulator outputs, the accelerometer waveform generator generating a plurality of accelerometer waveform generator outputs;
a filter circuit that receives and filters noise from the plurality of accelerometer waveform generator outputs to generate a plurality of filtered accelerometer waveform generator outputs;
a mixer circuit that receives and combines each of the plurality of filtered accelerometer waveform generator outputs to generate a single filtered accelerometer waveform generator output; and
a charge converter circuit that receives and converts the single filtered accelerometer waveform generator output to a current charge vibration simulation output.

9. The simulated engine accelerometer according to claim 8, the simulated engine accelerometer represent an actual accelerometer placed at a specific test location on the engine and provides simulated vibration signal output to a monitor unit consistent with the actual accelerometer at the specific test location over various engine speeds.

10. The simulated aircraft engine accelerometer according to claim 8, wherein the engine simulator further comprises:
a plurality of simulated speed outputs each representative of an actual speed of a specific component of an aircraft engine, the specific component being one of a fan, a compressor and a turbine; and
simulated vibration output of one of a non-aircraft engine source of vibration and an engine non-shaft source of vibration.

11. The simulated aircraft engine accelerometer according to claim 10, wherein the accelerometer signal simulator further comprises:
a plurality of vibration speed simulators that receive each of the plurality of simulated speed outputs and the at least one simulation vibration output and generates a respective vibration speed output;
a plurality of phase angle manipulators that receive each respective vibration speed output and inserts a phase angle value to generate a respective phase angle output; and
a plurality of amplitude manipulators that receive each respective phase angle output and modifies an amplitude value to generate a respective amplitude output.

12. The simulated aircraft engine accelerometer according to claim 11, the accelerometer waveform generator further comprises:
a digital-to-analog (D/A) converter that receives and converts the reference timing signal to an analog reference timing signal;
a plurality of D/A converters that convert each respective amplitude output to a respective analog signal output; and
a synchronized pulse generator that receives the analog reference timing signal and synchronizes at least two of the analog signal outputs via the plurality of D/A converters to generate a respective synchronized analog signal output.

13. The simulated aircraft engine accelerometer according to claim 12, the filter circuit comprising a plurality of filters that receive each respective synchronized analog signal outputs and each non-synchronized respective analog signal outputs to generate corresponding filtered signal outputs.

14. The simulated aircraft engine accelerometer according to claim 13, the mixer circuit receiving the corresponding filtered signal outputs including a vibration speed output, a phase angle output, an amplitude output, a synchronized analog signal output, and a non-synchronized analog signal output, the method further comprising generating the single filtered accelerometer waveform generator output from each of these outputs.

15. A method for simulating vibration testing of an engine, the method comprising:

generating a plurality of engine simulator outputs;

generating a plurality of accelerometer signal simulator outputs based on the plurality of engine simulator outputs;

synchronizing at least one of the plurality of accelerometer signal simulator outputs to a reference timing signal from one of the plurality of engine simulator outputs, and generating a plurality of accelerometer waveform generator outputs;

filtering noise from the plurality of accelerometer waveform generator outputs and generating a plurality of filtered accelerometer waveform generator outputs;

combining each of the plurality of filtered accelerometer waveform generator outputs to generate a single filtered accelerometer waveform generator output; and converting the single filtered accelerometer waveform generator output to a current charge vibration simulation output.

16. The method according to claim 15, wherein generating the plurality of engine simulator outputs further comprises:

generating a plurality of simulated speed outputs each representative of an actual speed of a specific component of an aircraft engine, the specific component being one of a fan, a compressor and a turbine; and generating at least one simulation vibration output of one of a non-aircraft engine source of vibration and an aircraft engine non-shaft source of vibration.

17. The method according to claim 16, wherein generating the plurality of accelerometer signal simulator outputs further comprises:

generating vibration speed outputs for each of the plurality of accelerometer signal simulator outputs;

generate a phase angle output for at least one the plurality of accelerometer signal simulator outputs; and generate an amplitude output for each of the plurality of accelerometer signal simulator outputs.

18. The method according to claim 17, wherein synchronizing the at least one of the plurality of accelerometer signal simulator outputs further comprises:

converting the reference timing signal to an analog reference timing signal;

converting each amplitude output to an analog signal output; and synchronizing at least two of the analog signal outputs to generate a synchronized analog signal output.

19. The method according to claim 18, wherein the filtering noise from the plurality of accelerometer waveform generator further comprises:

receiving each synchronized analog signal outputs and each non-synchronized analog signal outputs to generate filtered signal outputs.

20. The method according to claim 19, wherein combining each of the plurality of filtered accelerometer waveform generator outputs further comprises:

receiving the filtered signal outputs including a vibration speed output, a phase angle output, an amplitude output, a synchronized analog signal output, and a non-synchronized analog signal output; and generating the single filtered accelerometer waveform generator output from each of these outputs.

* * * * *